United States Patent [19]
Asbeck et al.

[11] Patent Number: 5,311,158
[45] Date of Patent: May 10, 1994

[54] HIGH POWER TUNING DEVICE USING LAYERED VARACTORS

[75] Inventors: Peter M. Asbeck, San Diego, Calif.; Richard C. Edwards, Cedar Rapids, Iowa; Garth D. Hammond, Cleveland, Wis.; Dale W. Penner, Cedar Rapids, Iowa

[73] Assignee: Rockwell International Corporation, Seal Beach, Calif.

[21] Appl. No.: 911,551

[22] Filed: Jul. 9, 1992

[51] Int. Cl.⁵ .............................................. H03H 7/00
[52] U.S. Cl. .................................... 333/174; 333/185; 257/531; 257/601
[58] Field of Search ............... 333/174, 202, 245, 247, 333/185, 184, 206; 334/14, 15, 78; 257/277, 312, 480, 531, 601

[56] References Cited

U.S. PATENT DOCUMENTS

| | | | |
|---|---|---|---|
| 3,212,032 | 10/1965 | Kaufman | 333/174 |
| 4,216,451 | 8/1980 | Nishikawa et al. | 334/15 |
| 4,546,334 | 10/1985 | Nishikawa et al. | 333/206 |
| 4,725,739 | 2/1988 | McCartney et al. | 333/185 |
| 4,743,919 | 5/1988 | Chang et al. | 333/202 |
| 4,789,645 | 12/1988 | Calvicho et al. | 257/531 |
| 4,983,934 | 1/1991 | Okumura | 333/184 |
| 5,014,026 | 5/1991 | Wanjura | 333/185 |
| 5,220,193 | 6/1993 | Kasahara et al. | 257/595 |

*Primary Examiner*—Raymond A. Nelli
*Attorney, Agent, or Firm*—Kyle Eppele; M. Lee Murrah; H. Fredrick Hamann

[57] ABSTRACT

A variety of embodiments of varactor diodes are disclosed ranging from an $N \times N$ matrix assembly of individually packaged diodes arranged in N rows and columns to a multi-continuous layered varactor. The matrix assembly varactor has N rows of discrete devices electrically coupled in parallel and multiple rows vertically aligned and electrically coupled in series to each other. The overall matrix assembly capacitance equals the individual diode capacitance of such assembly. When used as a tuning component across a tank coil transmission line, the RF voltage across any device in the matrix assembly is equal to the tank voltage divided by N.

14 Claims, 7 Drawing Sheets

HIGH POWER TUNING DEVICE USING LAYERED VARACTORS

BACKGROUND OF THE INVENTION

The present invention relates to communication systems and more specifically to high power UHF filter elements.

Relays are used extensively for high power, UHF, switched-capacitor filters. The relay tuning time is presently restricted to approximately 1 millisecond. Switched-capacitor filters utilizing PIN-diodes can achieve tuning speeds of 100 microseconds or faster but require high-voltage and high-current power supplies to bias the PIN diodes in order to attain such high speed operation. Another limitation to contend with is that the current state of the art in PIN-diode technology does not support filter power-handling levels of 100 watts or greater. The highest power level for reasonable bandwidth, frequency-agile, switched-capacitor filters is approximately 25 watts, as typified by the F1556 which utilizes a bias supply of 500 Vdc and is available from the assignee of the present invention.

The F1556 filter represents a state of the art UHF switched-capacitor filter which uses PIN-diodes to achieve an approximate tuning time of 100 microseconds. Although the 100 microsecond tuning time can be met with PIN-diode switching, the resulting filter would require PIN-diode bias voltages greater than 1000 volts to achieve the 100 W power level. Such high switching voltage causes amplifier slew rate and EMI/noise problems. Moreover, suitable PIN-diodes with low "on" resistance, high "off" resistance, and 2000 V breakdown voltage are not presently available as commodity items.

Varactor tuned filters are an alternative to PIN-diode switched capacitor filters. Unfortunately, varactor diode tuned filters are currently limited to power levels less than 1 W because of the impracticality of building varactor devices with tuning voltages greater than 100 volts while retaining high unloaded Q (Qu). High-voltage varactors characteristically have high series resistance which degrades the Q.

Prior art in varactor diode tuning has included back-to-back varactors and some attempts at layering varactors to reduce the RF voltage across a given varactor. These prior attempts were typically unsuccessful, in part because standard miniature packaging concepts were not suitable for power applications that require special large scale packaging. In some instances, varactors were integrated into a size where the high lead inductance limited the tuning range as it approaches series resonance, and degraded the unloaded Q of the varactor because of the higher current and consequently conductor loss in the bond wires.

The solution to this large scale packaging problem is the novelty of the proposed invention.

SUMMARY OF THE INVENTION

The present invention provides for a complex varactor diode device constructed in such a fashion allowing it to handle much higher RF voltage while retaining the capacitance versus control voltage characteristics of a simple varactor diode.

A variety of embodiments of applicant's varactor diode are disclosed ranging from an N×N matrix assembly of individually packaged diodes arranged in N rows and columns to a multi-continuous layered varactor. The matrix assembly varactor has N rows of discrete devices electrically coupled in parallel and multiple rows vertically aligned and electrically coupled in series to each other. The overall matrix assembly capacitance equals the individual diode capacitance of such assembly. When used as a tuning component across a tank coil transmission line, the RF voltage across any device in the matrix assembly is equal to the tank voltage divided by N.

The varactor array is packaged in such manner to minimize inductance and maximize Q. This results in a continuously variable reactance tuning element that can be used to tune high power (100 watts RF), highly selective filters while requiring minimal tuning power.

An 8×8 matrix assembly varactor diode comprising 64 abrupt junction diodes in microwave packages was constructed. A foreshortened quarter wave transmission line was used for a tank inductor with the 8×8 matrix assembly mounted at one end of a cavity rod. Alternating sets of back-to-back varactor rows were used to improve the RF linearity.

An alternate embodiment of the disclosed complex varactor diode utilizes a plurality of diode devices manufactured in accordance with standard integrated circuit technology and similarly assembled as packaged devices offering superior performance than the matrix assembly apparatus with respect to inductance.

It is an object of the present invention to provide UHF filter elements having improved operating characteristics compared to PIN diode switched devices.

It is a feature of the present invention to utilize a varactor diode device comprised of a plurality of diode rows vertically aligned with each other.

It is an advantage of the present invention that the varactor device disclosed herein provides faster switching while using relatively low power.

These and other objects, features and advantages are disclosed and claimed in the specification, figures and claims of the present application.

DETAILED DESCRIPTION OF THE FIGURES

Figure 1:
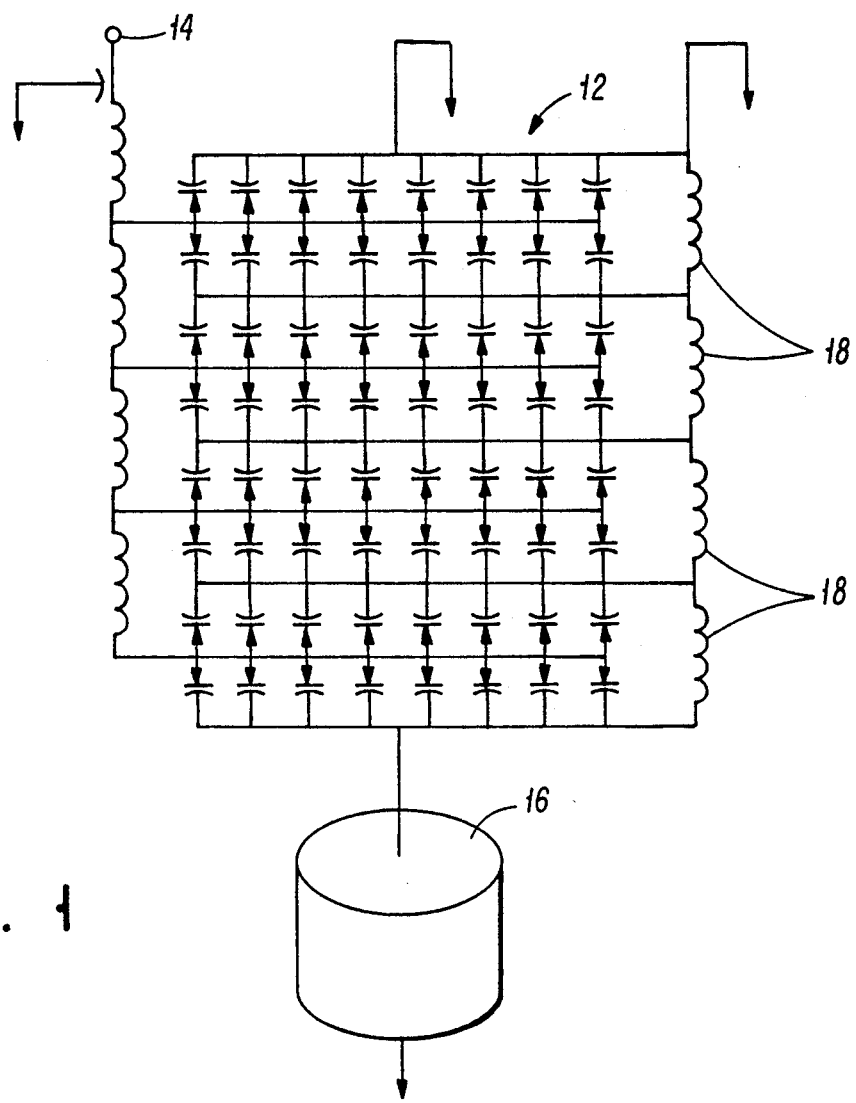
FIG. 1 shows a schematic 8×8 matrix array of packaged diodes incorporating the present invention.

Referring now to the FIGURES wherein like items are referenced as such throughout, FIG. 1 shows a schematic diagram of a tunable filter based upon the teachings of the present invention. An N×N matrix array, wherein N equals 8, of abrupt junction diodes 12, is connected to cavity rod 16 of a quarter-wave transmission line resonator as depicted in FIG. 1. A plurality of chokes 18 are also included in the depicted filter. The chokes serve to isolate the RF from the dc varactor tuning voltage which is connected at site 14.

Figure 2:
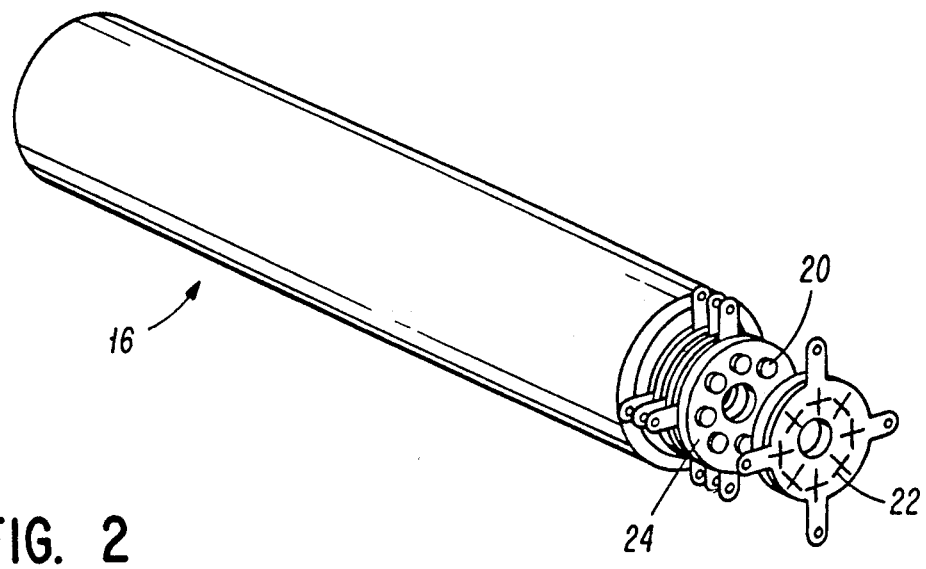
FIG. 2 shows an isometric view of the apparatus of FIG. 1 connected to a cavity rod.

FIG. 2 illustrates an isometric view of the apparatus of FIG. 1. Cavity rod 16 is shown with the N×N diode array at one end. The N×N matrix array of FIG. 1 is comprised of an assembly of discrete diode devices 20, contactor plates 22, and retainer rings 24 (also shown in FIG. 3). The contactor plates each have a plurality of individual spring contacts 23, for the packaged diodes and terminal lugs 25, providing for the bias chokes also shown in FIG. 1. Individual varactor diodes 20 are held in place and electrically coupled via contactor plates 22 and retainer rings 24. Alternating sets of back-to-back varactor rows were used to improve the RF linearity of the assembly.

The configuration described by FIGS. 1 and 2 is based upon the principle that when two terminal devices with identical electrical characteristics are connected in a matrix array the resulting two terminal characteristics of the matrix and single device are identical. Expanding the previous statement to an N×N matrix consisting of N rows and N columns of varactor devices provides analogous results. Assuming the individual varactor devices have substantially identical parameters, all varactor devices within a given N row are coupled in parallel and all rows are vertically aligned one on top of the other and electrically coupled in series. If the capacitance of each varactor device is equal to C, the N×N matrix also has an equivalent capacitance equal to C. Moreover, the non linearities, parasitic inductance and unloaded Q properties of the matrix are identical for the matrix array and single device block diagram circuit analysis. Thus, if the above described matrix array is used as a tuning component across a tank coil/transmission line, the RF voltage across any varactor device in the matrix array is equal to the tank voltage divided by N.

It should be noted that the energy tuned across a hypothetical single device ($CV^2/2$) is identical to the energy tuned by the matrix of devices. Stated another way, the matrix capacitance, $CN^2$, times the voltage squared, $(V/N)^2$, divided by 2 is also equal to ($CV^2/2$). Either concept requires the same energy for a given change in tuning voltage. Presently, single cell varactor technology is not feasible for breakdown voltages greater than 100 Vdc. Also remember that high voltage (greater than 1000 Vdc) designs are not only hazardous, but present special environmental design problems (humidity, altitude, etc.). The matrix array approach is therefore advantageous even though future advances in varactor devices may provide high voltage units.

Figure 3:
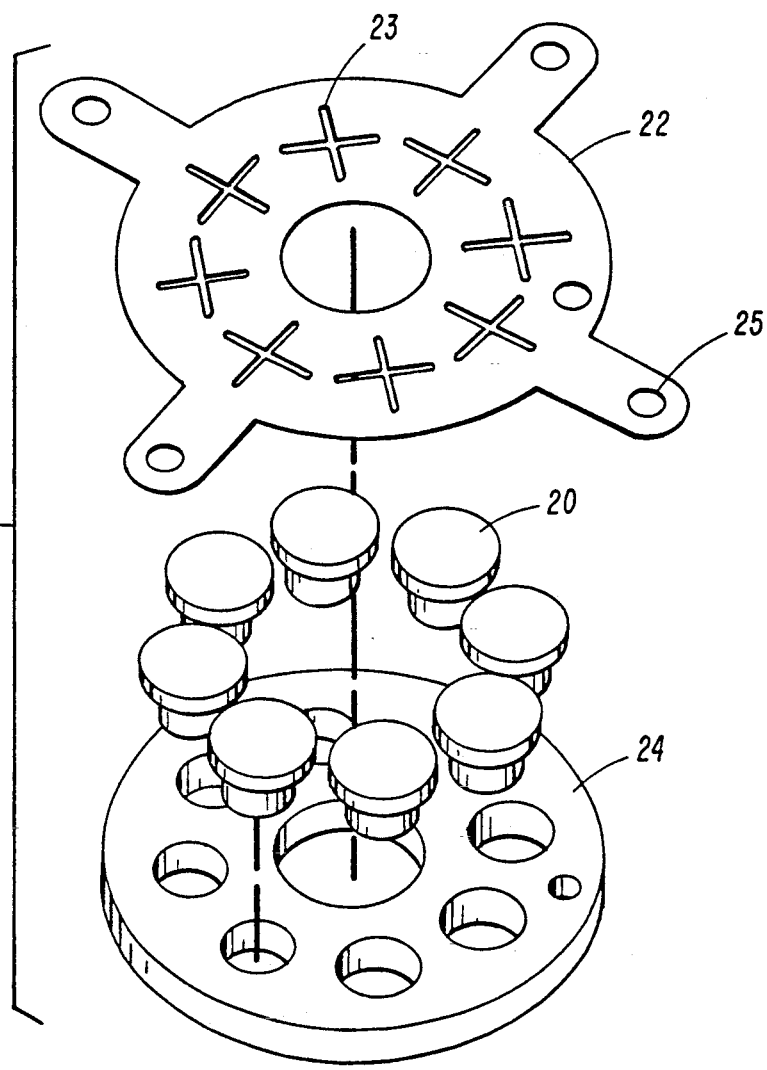
FIG. 3 illustrates an exploded isometric view of the packaging technique of the apparatus of FIG. 2.

FIG. 3 is an exploded isometric view of one layer of the varactor matrix assembly of FIG. 2. A contactor plate 22, retainer ring 24 and eight varactor diodes 20 are depicted. Varactor diodes 20 are shown in commercially available packages that resemble ammunition "rim fire" cartridges. Diodes were assembled in microwave packages commercially available and modified by having the respective strap leads removed. Varactor diodes 20 are positioned equidistant from immediately adjacent diodes and proximately located along the periphery of retainer ring 24. The diodes were mounted along the retainer ring periphery where the current density is appreciable due to the skin effect phenomenon.

There are three main parts of the matrix assembly. Contactor plate 22 is comprised of thin beryllium copper approximately 0.003 inches thick. The cross-shaped openings 23 provide 16 compliant contact points, 8 contacts up and 8 contacts down. Four solder lugs 25 are provided for inductor attachment.

Retainer ring 24 serves to rigidly hold diodes 20 as aligned with the contactor plate 22. A low dielectric constant and loss tangent material such as a thermosetting cross-linked polystyrene (Rexolite) should be used.

The three main parts of the interconnect are stacked one on top of the other, in order, cathode to cathode and anode to anode, until there are eight layers deep (64 diodes). Insertion of the diodes is similar to loading a revolver pistol.

Figure 4:
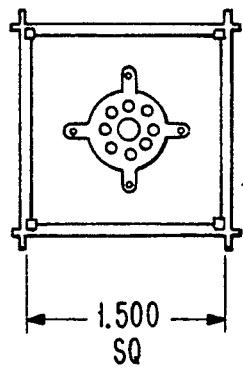
FIG. 4 illustrates a lateral cross-sectional view of the apparatus of FIG. 2.
Figure 5:
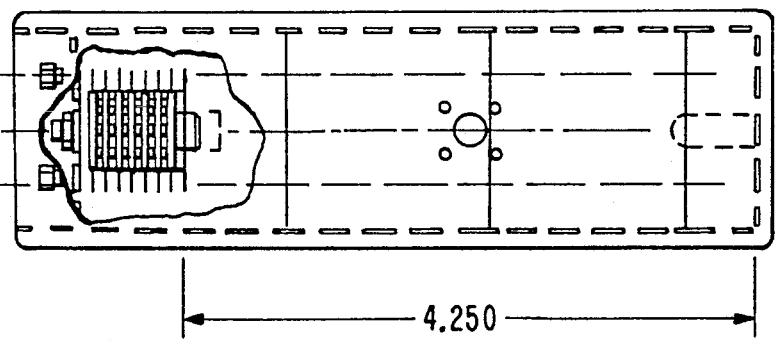
FIG. 5 illustrates a partially broken away side view of the apparatus of FIG. 2.

The physical appearance of one embodiment of the apparatus of FIGS. 1 through 3 is illustrated in FIGS. 4 and 5 (dimensions in all Figures are in inches). The array of 64 commercially available varactor diode components were assembled to tune a resonator cavity. The cavity dimensions shown support a frequency band of 225 MHz to 400 MHz. It is understood that the cavity could be made to tune other bands by changing the physical dimensions.

It should be noted that critical to the tuning scheme is the method used to assemble varactor diodes 20. In order to support a high "Q" resonator a variety of parameters must be taken into consideration. First, the current path of the matrix assembly should be kept as short as possible. Additionally, the matrix current path should align with the natural flow of current within the resonator cavity. Finally, materials within the matrix assembly should exhibit low dielectric constant and low loss-tangent values.

The resonant frequency, 1-dB compression point, and unloaded Q were measured using both a single varactor and the 8×8 varactor matrix assembly. The tank tuned within 2% of the same frequency for the two tuning devices using a tuning voltage change of 4 to 60 volts. Theoretically, because the RF voltage is divided by 8 for an 8×8 matrix, it should withstand 20 log(8)=18 dB more RF voltage for the same nonlinearity criteria. As expected, the 1-dB compression point was increased by greater than 20 dB.

Also of interest, the unloaded Q improved by 25% due to reduced conductor loss for the effective series inductance of the matrix assembly. The matrix assembly exhibited a higher portion of inductance associated with displacement current and consequently had lower loss than a single varactor where the bond wire is the major portion of the inductance. This result is desirable since the unloaded Q is being set primarily by the varactor semiconductor material rather than ohmic losses in the packaging. Use of gallium arsenide instead of silicon would have provided even greater measured improvement.

The above described apparatus served to verify that the effective lead inductance of the single varactor in the cavity is much greater than the package inductance published for the package (2 nH versus 0.5 nH for the microwave package). While it is tempting to use standard wire formulas for determining inductance of bond wires, the inductance is appreciably larger when the wire is used in a large geometry coaxial resonator. The reason for this is that a short length of isolated wire has a significant portion of the flux that does not link with the wire's current thereby resulting in considerably less inductance than if all the flux links its current. The former is achieved when the wire becomes the inner conductor of a large TEM resonator. It should be noted that the 0.5 nH given in the vendors specification is inferred by cavity measurements where the microwave package size is an appreciable part of the cavity size and hence appears smaller in inductance.

The effective measured series inductance of the 8×8 matrix assembly was approximately 4 nH which was slightly greater than the inductance of transmission line with the same 1.5 inch square outer conductor and an inner conductor diameter equal to the diameter of the matrix assembly. If the varactor material could be evenly distributed in a continuous ring around the periphery, 3 nH inductance could be achieved. It should be noted that while displacement rather than conductive current is predominant along the approximate 0.8 inch length of the 8×8 matrix assembly, the inductance and length is essentially the same as a metal conductor having the same dimensions as the matrix assembly.

Although the 8×8 matrix model described earlier is suitable for UHF frequencies, the effective series inductance of the matrix assembly is not suitable for L-Band frequencies. The matrix assembly series inductance may be reduced by using continuous layers of varactor material rather than discrete devices around the periphery. Even more important, the distance between varactor layers should be minimized since the equivalent series inductance is proportional to the total length of the matrix assembly.

Figure 6:
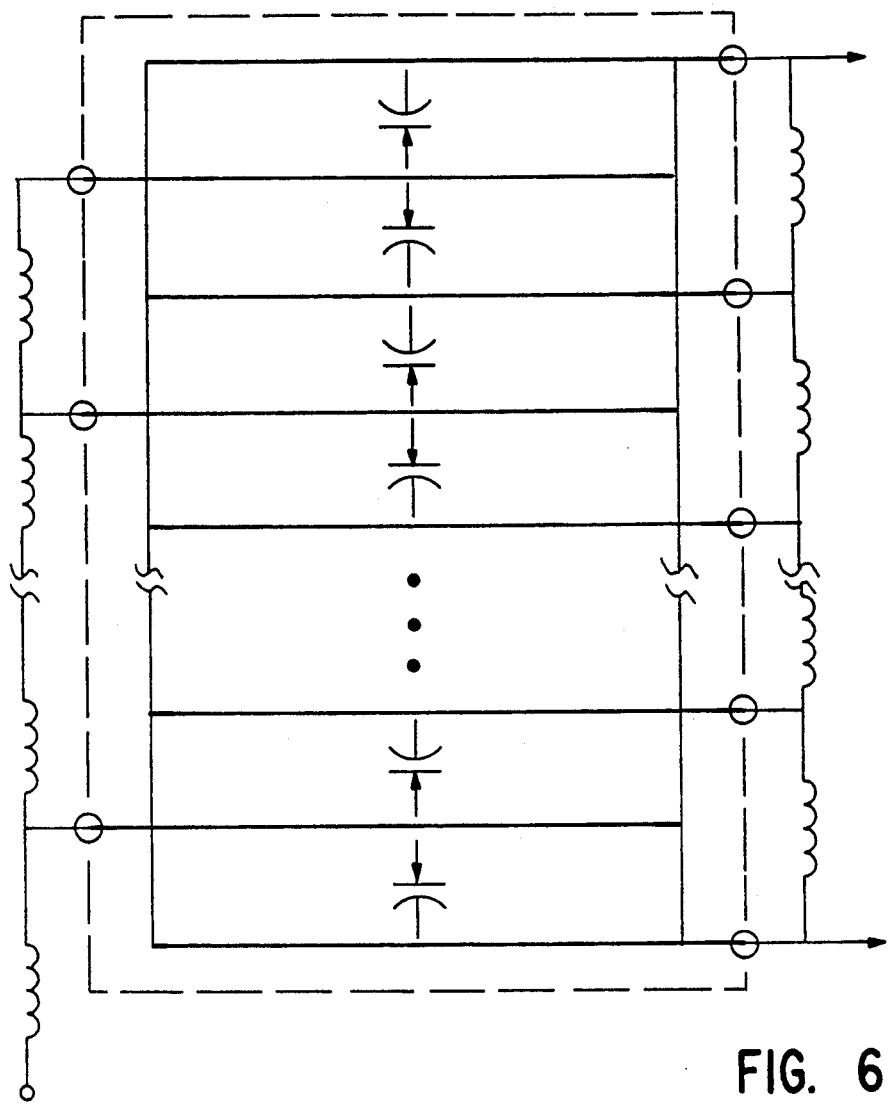
FIG. 6 is a schematic diagram of a general N layered varactor diode.

FIG. 6 is a schematic of an "N"-layered varactor (where N is an integer) which is functionally similar to the apparatus described in FIGS. 1-5. The discrete varactors devices have been replaced by layers of continuous varactor material. This varactor layer concept minimizes the effects of the inductance problems described above.

Figure 7:
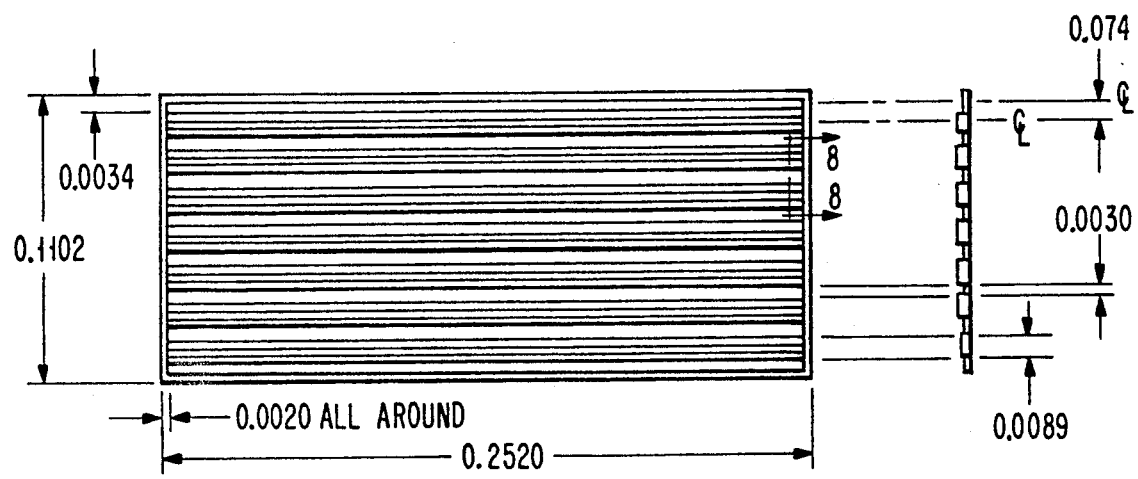
FIG. 7 is a top plan view of a gallium arsenide layered varactor diode.

Similarly, varactor layers can be deposited on a common substrate as shown in FIG. 7 by using common integrated circuit manufacturing process techniques for multi-layered integrated circuits. The resultant layered device provides the optimum solution to the large scale packaging problem encountered in the matrix assembly apparatus. The distance between back-to-back varactor layers is only a few millimeters in length and the inductance and conductor losses are therefore minimal. Approximate measurement in inches for one embodiment of this technique are shown in FIG. 7.

Gallium arsenide is recommended for the semiconductor material, thereby yielding approximately one fourth of the resistivity of silicon material. This results in an approximate improvement of four to one in unloaded Q when gallium arsenide is used instead of silicon. Theoretically this concept can be continued to any size desired; however, due to limitations in the present technology, the largest practical size device providing economical manufacturing yields was set at 14 layers with 80 pF (at 4 Vdc) per layer and approximately 0.4 millimeters in length.

Figure 8:
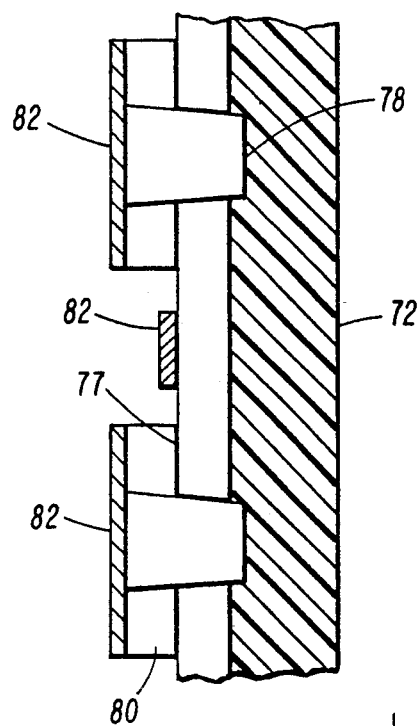
FIG. 8 is a highly magnified portion of the end view of the apparatus of FIG. 7.

FIG. 8 depicts a highly magnified portion of FIG. 7 (as located by the cutting plane lane 8—8 on FIG. 7.) A semi-insulating GaAs layer 72 is below anode region 80 and cathode regions 77. As shown, the anode and cathode regions alternate across the surface of the substrate. An n+ GaAs doped layer 77 is formed onto layer 72. The anodic regions have a polymide layer 78 and n− GaAs layers 80 formed prior to application of metallization layer 82 to both anode and cathode regions.

Figure 9:
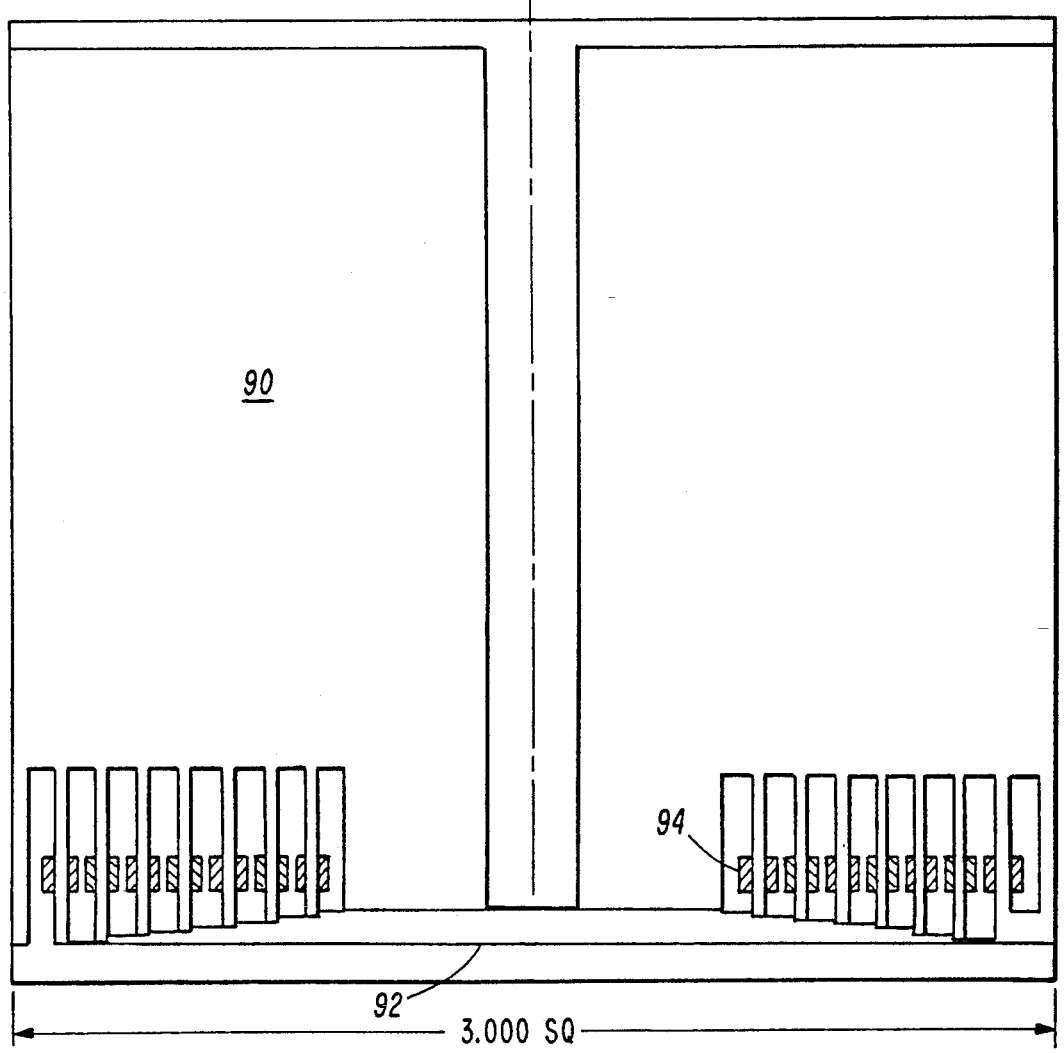
FIG. 9 illustrates a multi-layer array microstrip tuner device utilizing a varactor diode device.

While these GaAs devices may be connected in parallel such as four chips forming a square connected to the transmission line instead of the 8×8 matrix shown in FIG. 3, a preferred embodiment is shown in FIGS. 9 and 10.

Figure 10A:
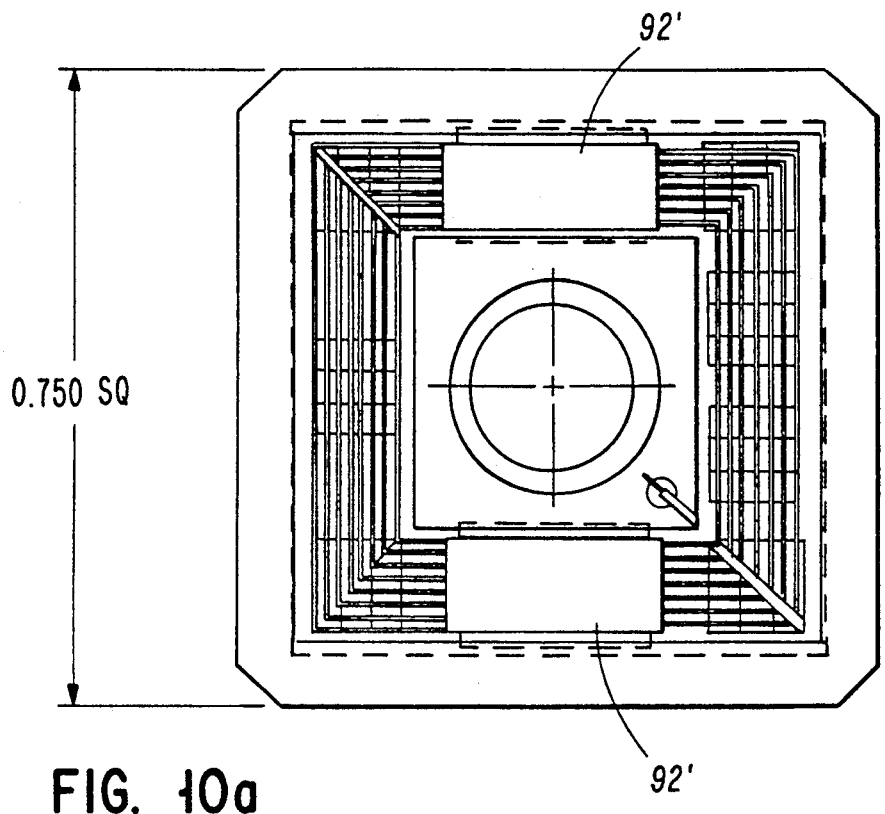
FIGS. 10a and 10b illustrate a top and bottom view, respectively, of a multi-layer array component having four varactor devices.
Figure 10B:
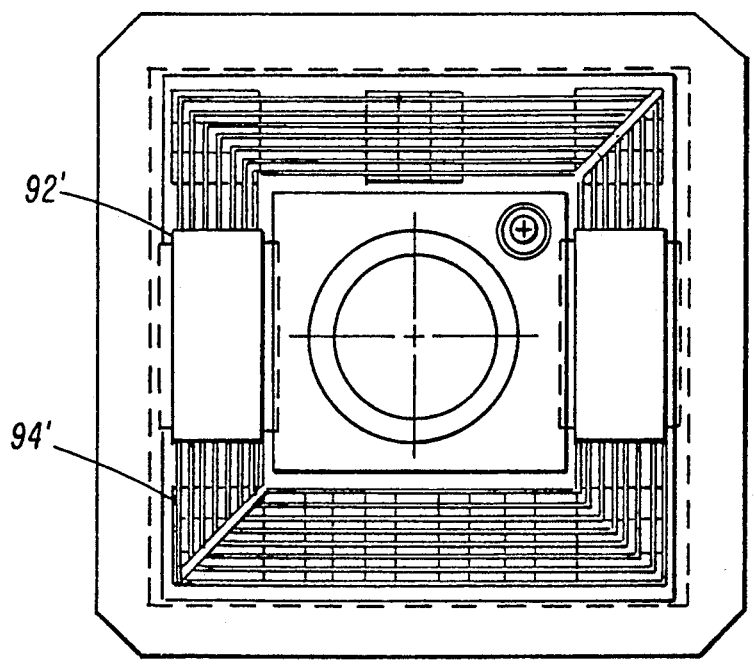
Figure 11A:
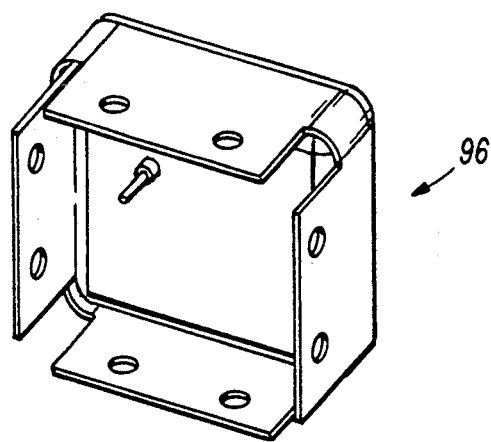
FIGS. 11a–11e illustrate sub-assembly details of a multi-layer varactor array component.
Figure 11B:
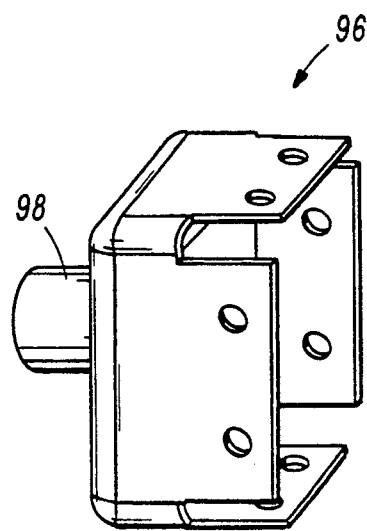
Figure 11C:
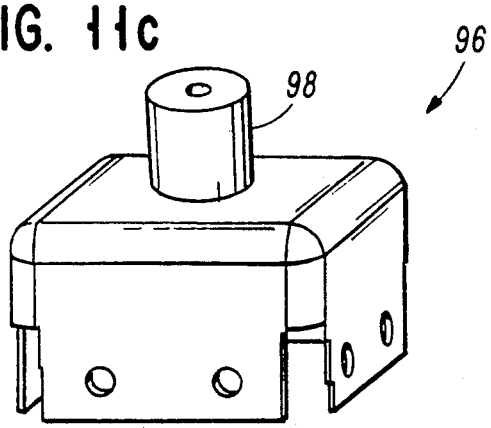
Figure 11D:
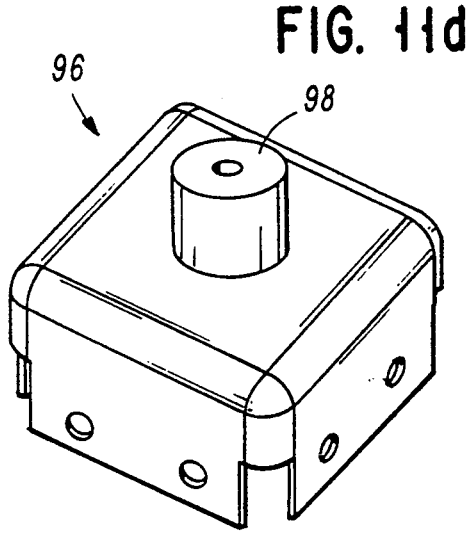
Figure 11E:
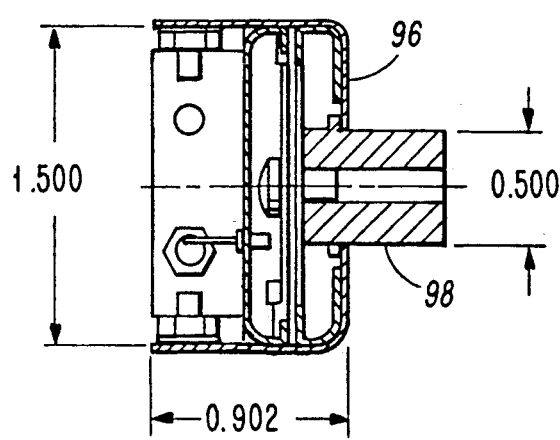

The implementation of FIG. 9 depicts a stripline tank having a ceramic circuit board 90 containing a layered varactor device 92 and inductors 94 for connecting the varactor device to the circuit board. FIGS. 10a and 10b depict a plurality of multi-layered varactor components capable of handling increased power in contrast to the apparatus of FIG. 9. Similar variations of the apparatus of FIGS. 10a and 10b (not shown) can accommodate increased power requirements and have key parameters detailed in Table 1 below. The embodiments described in Table 1 vary primarily in the number of layers of varactors and the number of rows of varactors. Increasing the number of layers reduces the voltage across individual varactors, thus allowing higher total power for the tuner assembly. As the number of layers increases, the number of rows must also increase to keep circuit capacity constant. Using the matrix concept results in 14, 28, and 56 layer tank tuners having approximately equal capacitance values.

TABLE 1

| Key Parameters of Alternate Embodiments of Varactor Capacitor Apparatus | | | | |
|---|---|---|---|---|
| | FIG. 9 | FIG. 10 | No Fig. | No Fig. |
| No. Layers: | 14 | 14 | 28 | 56 |
| No. Varactor Chips | 1 | 4 | 16 | 64 |
| Substrate Layers | 1 | 2 | 2 | 2 |
| Substrate Thickness | .050 | .025 | .050 | .050 |
| Substrate Size (in. sq.) | 3.0 | 0.75 | 1.5 | 3.0 |
| No. Inductors | 14 | 14 | 28 | 56 |
| Power (Watts) | 1.56 | 6.25 | 25 | 100 |

All of the tuner implementations described in Table 1 utilized alumina substrates with etched gold circuits. Other low loss dielectric and conductor combinations may also be used. Laser plated through holes provide top to bottom interconnect with low series inductance for the tank. The layered varactor and inductor devices are interconnected with bond wires utilizing common packaging techniques of the semiconductor assembly industry. The inductor devices may be any compatible commercially available item. To keep the series inductance as low as possible, bond wires are required at varactor layer junctions. As many as 50 wire bonds may be required on each long side of each varactor device. The largest tuner (56 layers) may have approximately 5,000 wire bonds. Larger varactor devices, would significantly reduce the wire bonding effort.

Figure 12A:
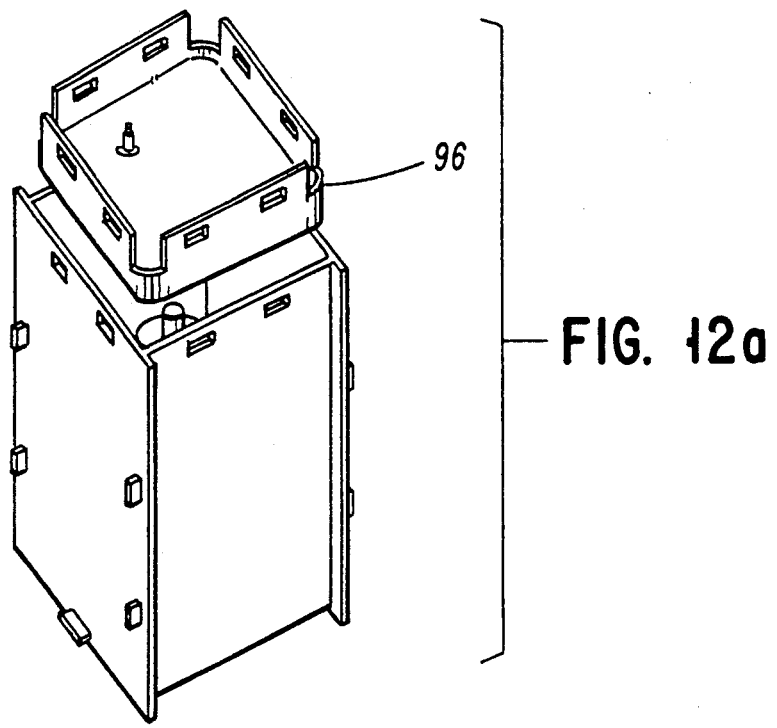
FIGS. 12a–12b illustrate a single barrel tank assembly apparatus incorporating the teachings of the present invention.
Figure 12B:
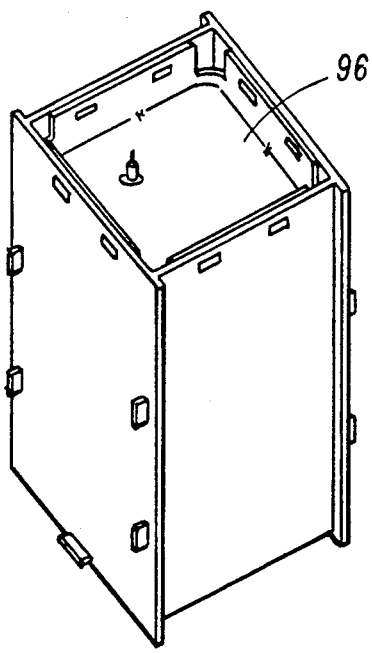

Encapsulation details shown in FIGS. 11a-11e are appropriate for all the tuner designs shown and described except for the microstrip of FIG. 9. The designs are simply scaled to accommodate the size of the respective circuit board. As can be seen in FIGS. 11a-11e, the enclosure design may consist of a multi-sided metallic "can" 96 and an inductor contact 98, cylindrically shaped as shown. The inductor contact is secured to the can using any commercially available conductive epoxy adhesive material. Soft soldering, may be used to seal and secure the tuner assembly. The tuner assembly shown in FIGS. 11a–11e is joined to the tank as depicted in FIGS. 12a and 12b.

It is thought that the methods of the present invention and many of its attendant advantages will be understood from the foregoing description, and it will be apparent that various changes may be made in the form, construction and arrangement of the parts and the steps thereof without departing from the spirit and scope of the invention, or sacrificing all their material advantages, the forms described herein being merely preferred embodiments thereof.

We claim:

1. A varactor capacitor filter comprising:
   a plurality of continuous layered varactor diode materials;
   a plurality of choke devices; and
   a packaging means;
   wherein said packaging means serves to electrically couple said layered varactor diode materials and said choke devices to allow said varactor capacitor filter to operate at an RF voltage which is increased in proportionally to the number of varactor diode layers utilized.

2. Said apparatus of claim 1 wherein an operating voltage is less than 100 Vdc.

3. Said apparatus of claim 2 wherein an operating speed is approximately 100 microseconds.

4. Said apparatus of claim 1 wherein an layer varactor diode material is gallium arsenide.

5. Said apparatus of claim 1 wherein said plurality of choke devices acts to isolate said RF voltage from said dc varactor tuning voltage.

6. A varactor capacitor filter comprising:
   a plurality of discrete varactor diodes arranged in an N×N matrix assembly;
   a plurality of choke devices; and
   a matrix packaging means;
   wherein said matrix packaging means serves to electrically couple said plurality of discrete varactor diodes and said plurality of choke devices to allow said varactor capacitor filter to operate at an RF voltage which is increased in proportionality to the number of varactor diode layers utilized.

7. Said apparatus of claim 6 wherein said matrix packaging means is comprised of a plurality of contactor plates and retainer rings.

8. Said apparatus of claim 7 wherein said contactor plates are comprised of beryillium copper and said retainer ring is comprised of a thermosetting cross-linked polystrene material.

9. Said apparatus of claim 6 wherein N equals eight.

10. Said apparatus of claim 6 wherein said plurality of choke devices isolate the RF voltage from a dc varactor tuning voltage.

11. A varactor capacitor filter comprising:
    a plurality of discrete varactor diodes each comprising;
    a ceramic alumina substrate having a thickness in the range of 0.025 and 0.050 inches and a surface size in the range of 0.75 to 3.00 square inches;
    a plurality of $n^+$ doped gallium arsenide anodic layers;
    a plurality of $n^-$ doped gallium arsenide cathodic layers; and
    terminal structures for electrically coupling said varactor capacitor filter to a circuit;
    wherein said filter is capable of handling one to one hundred watts of power.

12. Said apparatus of claim 11 wherein said varactor capacitor filter comprises four discrete varactor diodes each having fourteen cathodic and anodic layers.

13. Said apparatus of claim 11 wherein said varactor capacitor filter comprises sixteen discrete varactor diodes, said discrete varactor diodes each having twenty-eight cathodic and anodic layers.

14. Said apparatus of claim 11 wherein said varactor capacitor filter comprises sixty-four discrete varactor diodes, said discrete varactor diodes each having fifty-six cathodic and anodic layers.

* * * * *